United States Patent [19]

Chambers et al.

[11] 4,001,712
[45] Jan. 4, 1977

[54] ACTIVE FILTER WITH INVERSE OPTION

[75] Inventors: George S. Chambers, Waynesboro; L. Jubin Lane, Stuarts Draft, both of Va.

[73] Assignee: General Electric Company, Salem, Va.

[22] Filed: Dec. 18, 1975

[21] Appl. No.: 642,018

[52] U.S. Cl. .................................. 330/85; 330/107
[51] Int. Cl.[2] ......................................... H03F 1/36
[58] Field of Search ............ 330/85, 107, 109, 126, 330/151; 328/167

[56] References Cited

OTHER PUBLICATIONS

Perea et al., "Filtro Activo de Suppresion de Banda Sintonizable de Q Variable," *Revista Telegrafica Electronica*, pp. 130, 133 Mar. 1973.

*Primary Examiner*—James B. Mullins
*Attorney, Agent, or Firm*—Arnold E. Renner; Philip L. Schlamp

[57] ABSTRACT

An electronic filter circuit comprised of summing circuits and integrating circuits is interconnected such that the filter may use the same components to serve either as a band-reject or a band-pass filter having the same natural frequency. Changing of the filter operation between the two modes is accomplished simply by the interchange of two component values.

8 Claims, 4 Drawing Figures

ACTIVE FILTER WITH INVERSE OPTION

BACKGROUND OF THE INVENTION

The present invention relates generally to electronic filters and more particularly to an active electronic filter which, using the same components, may serve as either a band-reject or a band-pass filter having the same natural frequency.

Filters, as such, are well known in the art. Two well-known types are the band-reject filter and the band-pass filter. The band-reject filter acts to pass all frequencies of its input signal except those of a particular bandwidth which frequencies are attenuated to a degree depending upon the desired use of the filter. A band-pass filter operates in the opposite manner in that it passes a band of frequencies and rejects the rest. In accordance with customary terminology as applied to filters, the center frequency of the band which is either passed or rejected is known as the natural frequency of the filter. Normally, the design of the filter is an individual process with the design being tailored to the individual need. Thus, the production of a variety of filters entails the availability of a large variety of components.

Historically, filter circuits were comprised of resistance-inductance-capacitance networks which had problems of insertion loss, critical tuning, etc. More recently, active filters comprised of networks using operational amplifiers have enjoyed great popularity. In this regard, reference is made to the book *Operational Amplifiers*, copyrighted in 1971 by Burr-Brown Research Corporation (Library of Congress Catalog No. 74-163297) and particularly to Chapter 8 of that book which discusses active filters.

Notwithstanding the advent of operational amplifier active filters, the individual design requirements and the problems attendant thereto have remained. In addition, certain problems such as those of sensitivity are not eliminated and in this regard attention is drawn to the staff article "Sensitivity—Key to Analog Active Filters" found in the November 1970 issue of "Electronic Design News" (pages 17 through 25).

SUMMARY OF THE INVENTION

It is, therefore, an object of the present invention to provide an improved active filter.

It is an additional object to provide an improved active filter having less sensitivity to temperature changes and component tolerances.

It is a further object to provide an active electronic filter which is operable in either a band-reject or a band-pass mode using the same electronic components.

It is another object to provide an active filter the mode of operation of which can be changed from a band-reject to a band-pass at the same natural frequency simply by the interchange of the values of two circuit components.

The foregoing and other objects are satisfied in accordance with the present invention by the provision of a filter circuit comprised of summing circuits and integrating circuits interconnected with a negative feedback path in a manner such that the same components serve either as a band-reject or a band-pass filter having the same natural frequency. The filter operation is changed between the two modes simply by interchanging the values of two circuit components.

In the preferred embodiment of the invention, operational amplifiers are employed in summing and integrating circuits and the changing of mode of filter operation is accomplished by interchanging the values of two resistors at the input of one of the operational amplifiers operating in the summing mode.

BRIEF DESCRIPTION OF THE DRAWING

While the present invention is particularly defined in the claims annexed to and forming a part of this specification, a better understanding thereof may be had from the following description taken in conjunction with the accompanying drawing in which:

DETAILED DESCRIPTION

Figures 1, 2:
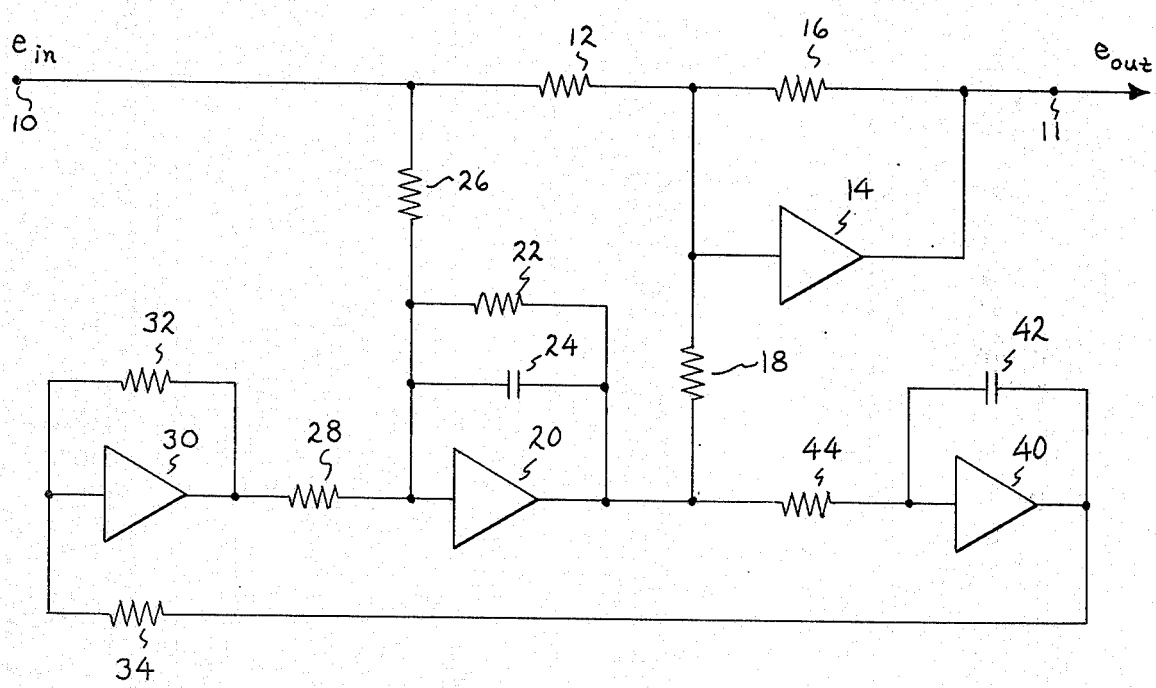
FIG. 1 is a graph, useful in understanding the invention, illustrating a typical band-reject characteristic for an active filter.
FIG. 2 is a schematic diagram of a band-reject filter as might be derived employing standard "state of variables" synthesis techniques.

Referencing first FIG. 1 there is shown a typical characteristic for a band-reject filter. The graph of this figure plots, on log scales, the filter gain as the ordinate and the angular frequency as the abscissa. As shown, the center point of the curve, that is the lowest point, is found at a point labeled $\omega_0$. $\omega_0$, as is well known in the art, is equal to $2\pi f_0$ wherein $f_0$ is the natural of center frequency of the filter in Hertz. While the depiction of FIG. 1 is for a band-reject filter, if the curve were inverted and placed into the first quadrant it would represent a typical band-pass curve or characteristic.

In certain applications, an example of which will be later given, it is desirable to employ both a band-reject and a band-pass filter having the same natural frequency. For example, in the particular application which led to the present invention, it was desired to have a band-reject filter having a transfer function, in Laplace Transform notation, defined by the equation $$H(S) = \frac{S^2 + \alpha_1 \omega_0 S + \omega_0^2}{S^2 + \alpha_2 \omega_0 S + \omega_0^2} \cdot M \qquad (1)$$

wherein:
$h(s)$ = transfer function of the band-reject filter
$S$ = Laplace Transform operator (equal to $\sigma + j\omega$)
$\alpha_1$ and $\alpha_2$ = damping factors
$\omega_0$ = natural or center angular frequency of the filter band
$M$ = overall filter gain.

This equation defines a filter which does not totally reject any frequency but which does substantially attenuate frequencies within the reject band. (It should be noted that equation (1) above is of the same general form as that presented on page 19 of the previously mentioned "Electronic Design News" article.)

At the natural frequency of the filter, that is the center frequency of the filter band, $\alpha_1/\alpha_2$ equals filter gain as is illustrated in FIG. 1. That this is so can be shown by assuming a sinusoidal input such that $\sigma$ of the Laplace Transform operator is equal to 0 and hence the term $S^2$ becomes equal to $-\omega_0^2$. As such, equation (1) becomes:

$$H(S) = \frac{-\omega_0^2 + \alpha_1\omega_0 S + \omega_0^2}{-\omega_0^2 + \alpha_2\omega_0 S + \omega_0} = \frac{\alpha_1}{\alpha_2}. \quad (2)$$

A band-pass filter responsive to the same natural frequency as the band-pass filter identified and described above will have a transfer function A(S) defined, using the same notation as above, by the relationship which is the inverse of equation (1) and is:

$$A(S) = H(S)^{-1} = \frac{S^2 + \alpha_2\omega_0 S + \omega_0^2}{S^2 + \alpha_1\omega_0 S + \omega_0^2} \cdot M. \quad (3)$$

The design of an operational amplifier to implement a given transfer function such as that defined in equations (1) or (3) above is normally accomplished using a synthesis technique based upon the "state of variables". This is a standard technique well known in the art and an explanation thereof may be found in Chapter 13 of *Introduction To Control Systems Design* by Virgil W. Eveleigh, published by McGraw-Hill Book Company, copyrighted 1972 (Library of Congress Catalog No. 73-160706).

Applying the state of variables technique to equation (1) above results in, after certain simplifications, the circuit illustrated in FIG. 2. As shown in that figure, an input signal $e_{in}$ is applied to an input terminal 10. This input signal will contain a large spectrum of frequencies and the operational mode of the filter as shown in FIG. 2 is that of band-reject. The signal applied to terminal 10 is fed by way of a resistor 12 to the inverting input of an operational amplifier 14. (In FIG. 2, as well as the FIG. 3, all operational amplifiers are indicated as having only a single input. As is well known, operational amplifiers have two inputs. However, since in each instance here the normal input is connected to ground (through a resistor if necessary) in a manner customary in the art, the additional connection has been omitted from the drawing for sake of simplicity.) Operational amplifier 14 works in the summing mode, includes a feedback resistor 16 connected between its output and its input and serves to provide an output designated $e_{out}$. The signal $e_{out}$ is proportional to the sum of the signal applied via resistor 12 and a second signal applied to the input of amplifier 14 by way of an additional input resistor 18.

The signal applied via resistor 18 is derived from the output of a second operational amplifier 20 having a resistor 22 and a capacitor 24 connected in parallel in a feedback path between its output and its input. Operational amplifier 20 and its related circuitry acts as a low pass filter; that is, a filter having a high gain at low frequencies and a small gain at high frequencies. Amplifier 20 has two input resistors 26 and 28 through which are fed, respectively, input signals $e_{in}$ and a signal which is the output of a third operational amplifier 30. Amplifier 30 has a resistor 32 connected between its output and its input and works in an inverting mode. The input to amplifier 30 is by way of a resistor 34 which receives a signal which is the output of a fourth operational amplifier 40. Amplifier 40 has a capacitor 42 connected between its output and its input and is provided with an input resistor 44 which receives the output of the operational amplifier 20. Amplifier 40 and its related circuitry operates in an integrating mode.

As will be understood by those skilled in the art and as was previously indicated, the depiction of FIG. 2 is the result of a simplification of the direct application of the state of variables synthesis technique as applied to equation (1) and will result in a band-reject filter. In the FIG. 2 circuit, operational amplifiers 30, 20 and 40 collectively comprise an inverting resonator, that is, a filter with a given gain and selectivity, and serves as a band-pass filter whose output voltage at the natural frequency lags its input voltage by 180°. Operational amplifier 14 sums the instantaneous values of the signal $e_{in}$ and the output of operational amplifier 20 such that, as the resonance of the natural frequency of the band-pass filter is approached, the output of amplifier 20 increases in amplitude and, because of the inversion from amplifier 30 to amplifier 40, the amplitude of the output signal $e_{out}$ decreases. Thus, as the natural frequency is approached, there is a band-reject characteristic from the signal at input terminal 10 ($e_{in}$) to the signal output terminal 11 ($e_{out}$).

While the circuitry shown in FIG. 2 will, for the most part, operate satisfactorily, it has a tendency to be sensitive to temperature variations and to component tolerances. Servomechanism technology teaches that sensitivity can be reduced through the use of a negative feedback path. No such path is found in the FIG. 2 circuit. In addition, although it has not here been shown, a similar design approach for a band-pass filter having the same natural frequency would result in a somewhat dissimilar circuit requiring different components and organization, thus necessitating additional components and parts for manufacture of the two types of filters having the same natural frequency.

Figure 3:
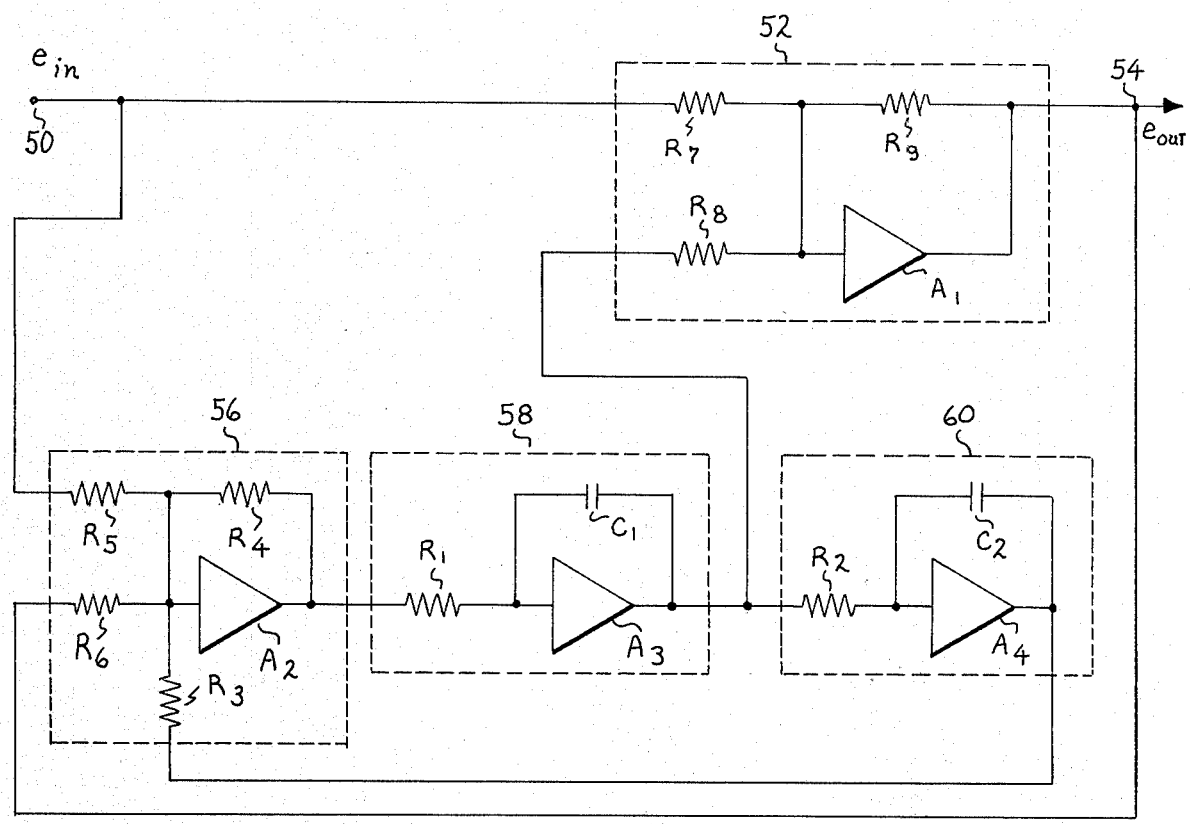
FIG. 3 is a schematic diagram showing the present invention in its preferred embodiment; and, FIG. 4 is a block diagram illustrating the use of filters in accordance with the present invention in a system for continually checking the operability of the circuit of the invention.

FIG. 3 illustrates the present invention in its preferred embodiment. Before beginning a detailed description of FIG. 3, it is believed proper to define certain conventions to be utilized. In FIG. 3 the several resistors and capacitors have been designated, respectively, by the characters R and C with appropriate subscripts. This same nomenclature is utilized in the equations which follow to specify the values of these components.

Turning now to FIG. 3, an input signal $e_{in}$ is applied to an input terminal 50 from whence it is fed to a summing circuit shown within the broken line box 52. The signal $e_{in}$ serves as one input to an operational amplifier $A_1$ by way of a resistor $R_7$. A second input signal is applied to the amplifier $A_1$ by way of a resistor $R_8$ and a feedback resistor $R_9$ is connected between the output and input of the amplifier $A_1$ such that the circuitry within block 52 acts, as was indicated, as a summing circuit. The output of the amplifier $A_1$ is applied to a terminal 54 and serves as the output signal, $e_{out}$, of the circuit of the present invention.

The input signal $e_{in}$ is also applied to a second summing circuit shown within block 56. This circuit consists of an operational amplifier $A_2$ having a feedback resistor $R_4$ and three input resistors $R_5$, $R_6$ and $R_3$. The input signal $e_{in}$ is applied to operational amplifier $A_2$ by way of resistor $R_5$ and the second input to amplifier $A_2$ is the signal from terminal 54, the output of amplifier $A_1$, which is returned as a negative feedback signal through $R_6$ to the amplifier $A_1$.

The output of the summing circuit 56 is applied to an integrating circuit shown within the broken line box 58. This circuit includes an operational amplifier $A_3$ having a capacitor $C_1$ connected between its output and its input and an input resistor $R_1$ by which the signal from the summing circuit 56 is applied. The output of this integrating circuit forms the second input to the operational amplifier $A_1$ of block 52 by way of the resistor $R_8$ and also serves as an input to a second integrating circuit shown within block 60. The integrating circuit of block 60 includes an operational amplifier $A_4$ having a capacitor $C_2$ connected between its output and its input and an input resistor $R_2$ for receiving the input from the integrating circuit 58. The output of amplifier $A_4$ (block 60) serves as a third input to the operational amplifier $A_2$ of block 56 and is applied thereto by way of the resistor $R_3$.

The transfer function C(S) of the circuitry of FIG. 3 with respect to the input and output signals is as follows:

$$C(S) = \frac{E_{out}(S)}{E_{in}(S)} = \frac{R_8}{R_7} \left[ \frac{S^2 + \frac{R_4 R_7}{R_5 R_9 R_1 C_1} S + \frac{R_4}{R_1 C_1 R_2 C_2 R_3}}{S^2 + \frac{R_4 R_8}{R_6 R_9 R_1 C_1} S + \frac{R_4}{R_1 C_1 R_2 C_2 R_3}} \right] \quad (4)$$

The similarity of equation (4) to the two transfer function equations (1) and (2) is believed apparent and from this similarity it can be determined that the circuitry of FIG. 3 may be utilized to implement either the band-reject function H(S) or the band-pass function A(S). However, in order to implement these functions certain identifies must be satisfied. Specifically, in implementing either H(S) or A(S) the following relationship must exist.

$$\omega_0^2 = \frac{R_4}{R_1 C_1 R_2 C_2 R_3}. \quad (5)$$

In implementing H(S), $$\alpha_1 \omega_0 = \frac{R_4 R_7}{R_5 R_9 R_1 C_1} \quad (6)$$

and, $$\alpha_2 \omega_0 = \frac{R_4 R_8}{R_6 R_9 R_1 C_1}. \quad (7)$$

In implementing A(S), $$\alpha_2 \omega_0 = \frac{R_4 R_7}{R_5 R_9 R_1 C_1} \quad (8)$$

and, $$\alpha_1 \omega_0 = \frac{R_4 R_8}{R_6 R_9 R_1 C_1}. \quad (9)$$

From equations (6) through (9) taken in conjunction with equations (1), (2) and (4) it is readily seen that if resistors $R_7$ and $R_8$ are made equal, as is easily done, then the only difference in the required relationship for H(S) and A(S) is with respect to resistors $R_5$ and $R_6$. It is further seen that by interchanging the values of resistors $R_5$ and $R_6$ the circuitry of FIG. 3 can be changed between a band-reject and a band-pass filter both having the same natural frequency. Thus, for either type filter the identical components are used which reduces manufacturing problems and necessitates only a minimum inventory. In addition, it is noted that the negative feedback path extending between terminal 54 and block 56 by way of resistor $R_6$ is in keeping with good servomechanism practice and will aid in providing stability to the system and make the overall circuit less sensitive to temperature changes as well as component tolerances.

The actual value of the several components utilized in the making of a filter in accordance with the present invention will, of course, vary in accordance with the desired result. An an example, however, a band-reject filter having a natural frequency of 36.84 Hertz, $\alpha_1 = 0.12$ and $\alpha_2 = 1.2$ may be constructed using the following components.

Operation Amplifiers = Op-05 by Precision Monolithics $C_1 = 0.24 \mu f$
$C_2 = 0.24 \mu f$
$R_1 = 18 K\Omega$
$R_2 = 18 K\Omega$
$R_3 = 10 K\Omega$
$R_4 = 10 K\Omega$
$R_5 = 83.3 K\Omega$
$R_6 = 8.33 K\Omega$
$R_7 = 10 K\Omega$
$R_8 = 10 K\Omega$
$R_9 = 10 K\Omega$ In accordance with the present invention, a band-pass filter having the same natural frequency would employ the identical components but the values of $R_5$ and $R_6$ would be interchanged; i.e., $R_5$ would be made 8.33KΩ and $R_6$ would be made 83.3KΩ.

Figure 4:
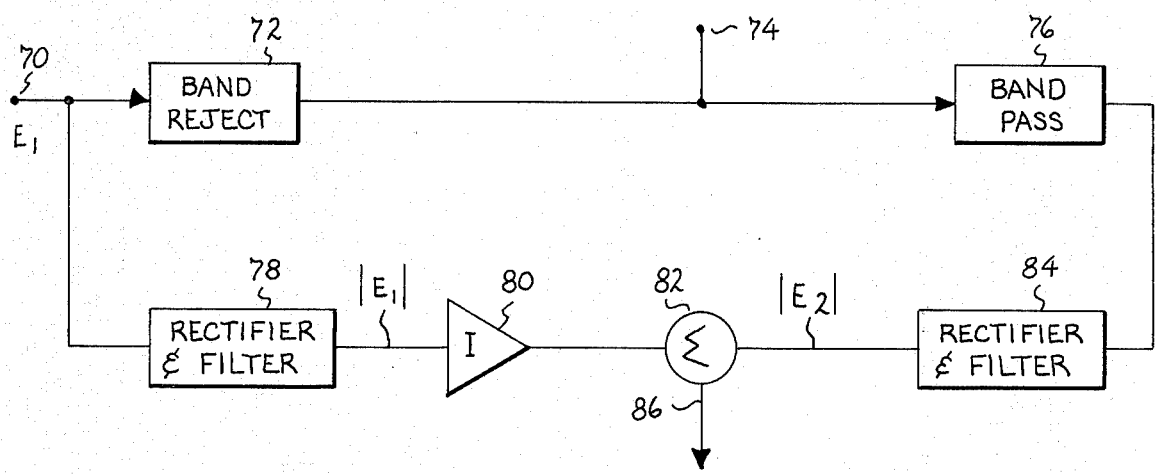

FIG. 4 illustrates one example of an application in which the present invention proved to be particularly advantageous. In this application, the output of a band-reject filter was utilized to control a critical operation and it was desired to have some means to provide a continuous check to insure that the band-reject filter was operating properly. The FIG. 4 implementation achieved this function. As shown in FIG. 4, there is provided an input signal $E_1$ at an input terminal 70. This signal is applied to a band-reject filter 72 constructed in accordance with the present invention. The output of filter 72 is applied to a terminal 74 and utilized in the control of the critical operation. The output of the band-reject filter 72 is also supplied to a band-pass filter 76 which is the inverse of filter 72 and which is also made in accordance with the present invention. The input signal $E_1$ is additionally applied to a standard type of rectifier and filter network 78 which provided an output designated $|E_1|$ signifying the absolute magnitude of the signal $E_1$. The signal $|E_1|$ serves as the input to an inverter 80 the output of which is applied to a summing junction 82. The output of the band-pass filter 76 is fed to an additional rectifier and filter network 84 which provides an output signal $|E_2|$, signifying the absolute magnitude of the output from filter 76. This output is also applied to the summing junction 82. By adjusting the overall gains of the two filters 72 and 76 in a proper manner, the magnitudes of the signals $|E_1|$ and $|E_2|$ can be made equal. For example, assume that the band-reject filter attenuated a maximum of 100 units while the band-pass filter had an amplification of 100 units. In this situation the cascading of the filters will result in output from filter 76 which, if both filter circuits are operating properly, will be equal in magnitude to the input signal $E_1$. By then inverting one of the rectifier and filter network outputs — that inverted being shown as $|E_1|$ and summing the two signals $|E_1|$ and $|E_2|$ an indication of proper operation is achieved. That is, if all circuit elements shown in FIG. 4 are functioning properly, the output from the summing junction 82 will be substantially zero. In the event there is any failure within the system, including the critical band-reject filter 72, the output of the summing junction 82 will be other than zero and this signal appearing on line 86 can be utilized to take whatever corrective action is necessary or desired; e.g., shutting down the system, sounding an alarm, etc.

Thus, it is seen that there has been provided a unique filter circuit which utilizes the same components and which can be operated in either the band-reject or the band-pass mode simply by the interchange of two circuit components.

While there has been shown and described what is at present considered to be the preferred embodiment of the present invention, modifications thereto will readily occur to those skilled in the art. It is not desired, therefore, that the invention be limited to the specific arrangements shown and described and it is intended to cover in the appended claims all such modifications as fall within the true spirit and scope of the invention.

What is claimed is:

1. An electronic filter circuit operable as either a band-reject or a band-pass filter having the same natural frequency of input signal comprising:
   a. a first summing circuit for providing an output signal in response to first, second and third signals applied thereto through, respectively, first, second and third input resistors;
   b. a first integrating circuit for providing an output in response to the output of said first summing circuit;
   a second integrating circuit for providing an output in response to the output of said first integrating circuit;
   a second summing circuit, responsive to said input signal and to the output of said first integrating circuit, to develop an output signal for said filter circuit; and,
   e. means for applying, respectively, as the signals applied to said first summing circuit through said first, second and third resistors, said input signal, the output from said second summing means, and the output of said second integrating means, said first and second resistors having first values when the filter circuit acts as a band-reject filter and having values interchanged from said first values when the filter circuit acts as a band-pass filter.

2. A filter circuit in accordance with claim 1 wherein said filter circuit has a transfer characteristic defined by the formula:

$$H(S) = A(S)^{-1} = \frac{S^2 + \alpha_1\omega_0 S + \omega_0^2}{S^2 + \alpha_2\omega_0 S + \omega_0^2} \cdot M$$

wherein:
$H(S)$ = transfer function of a band-reject filter
$A(S)$ = transfer function of a band-pass filter
$S$ = Laplace Transform operator
$\alpha_1$ and $\alpha_2$ = damping factors
$\omega_0$ = center angular frequency of the filter band, and
$M$ = overall filter gain.

3. An electronic filter circuit operable as either a band-reject or a band-pass filter having the same natural frequency of input signal comprising:
   a. a first operational amplifier operable in a summing mode and having first, second and third input resistors;
   b. a second operational amplifier operable in an integrating mode responsive to an output of said first operational amplifier;
   c. a third operational amplifier operable in an integrating mode responsive to an output of said second operational amplifier;
   d. a fourth operational amplifier operable in a summing mode, said fourth operational amplifier having first and second inputs receiving, respectively, said input signal and the output of said second operational amplifier and providing an output serving as the output of the filter circuit; and,
   e. means for applying, respectively, to said first, second and third input resistors of said first operational amplifier, said input signal, the output signal of said fourth operational amplifier and the output of said third operational amplifier, said first and second resistors having differing first values when the filter circuit acts as a band-reject filter and differing second values when the filter circuit acts as a band-pass filter, said second values being the inverse of said first values.

4. A filter circuit in accordance with claim 3 wherein said filter circuit has a transfer characteristic defined by the formula:

$$H(S) = A(S)^{-1} = \frac{S^2 + \alpha_1\omega_0 S + \omega_0^2}{S^2 + \alpha_2\omega_0 S + \omega_0^2} \cdot M$$

wherein:
$H(S)$ = transfer function of a band reject filter
$A(S)$ = transfer function of a band-pass filter
$S$ = Laplace Transform operator
$\alpha_1$ and $\alpha_2$ = damping factors
$\omega_0$ = center angular frequency of the filter band, and
$M$ = overall filter gain.

5. An electronic filter circuit utilizing identical electrical components to operate either as a band-reject or a band-pass filter having the same natural frequency of input signal comprising:
   a. a first operational amplifier circuit including a feedback resistor ($R_4$) and first, second and third input resistors ($R_5$), ($R_6$) and ($R_3$);
   b. a second operational amplifier circuit responsive to an output of said first operational amplifier circuit, said second operational circuit including a feedback capacitor ($C_1$) and an input resistor ($R_1$);
   c. a third operational amplifier circuit responsive to an output of said second operational amplifier circuit, said third operational amplifier circuit including a feedback capacitor ($C_2$) and an input resistor ($R_2$);
   d. a fourth operational amplifier circuit, for providing an output signal of the filter circuit, including a feedback resistor ($R_9$) and first and second input resistors ($R_7$) and ($R_8$);
   e. means for applying said input signal and the output of said second operational amplifier circuit to said fourth operational amplifier circuit by way, respectively, of the included first and second resistors; and, f. means for applying as input signals to said first operational amplifier circuit by way of the included first, second and third input resistors respectively, the input signal, the output signal of said fourth operational amplifier circuit and an output of said third operational amplifier circuit.

6. A filter circuit in accordance with claim 5 wherein said filter circuit has a transfer characteristic defined by the formula:

$$H(S) = A(S)^{-1} = \frac{S^2 + \alpha_1 \omega_0 S + \omega_0^2}{S^2 + \alpha_2 \omega_0 S + \omega_0^2} \cdot M$$

wherein:

$H(S)$ = transfer function of a band-reject filter $A(S)$ = transfer function of a band-pass filter $S$ = Laplace Transform operator $\alpha_1$ and $\alpha_2$ = damping factors $\omega_0$ = center angular frequency of the filter band, and $M$ = overall filter gain.

7. The invention in accordance with claim 5 wherein the filter circuit has a transfer characteristic C(S) defined by the formula:

$$C(S) = \frac{R_8}{R_7} \left[ \frac{S^2 + \frac{R_4 R_7}{R_5 R_9 R_1 C_1} S + \frac{R_4}{R_1 C_1 R_2 C_2 R_3}}{S^2 + \frac{R_4 R_8}{R_6 R_9 R_1 C_1} S + \frac{R_4}{R_1 C_1 R_2 C_2 R_3}} \right]$$

wherein:

$S$ = Laplace Transform operator.

8. The invention in accordance with claim 7 in which the following relationships exist:

a) $$\omega_0^2 = \frac{R_4}{R_1 C_1 R_2 C_2 R_3}$$

wherein:

$\omega_O$ = center angular frequency of the filter band;

b. in implementing a band-reject filter:

$$\alpha_1 \omega_0 = \frac{R_4 R_7}{R_5 R_9 R_1 C_1}, \text{ and}$$

$$\alpha_2 \omega_0 = \frac{R_4 R_8}{R_6 R_9 R_1 C_1}$$

wherein $\alpha_1$ and $\alpha_2$ = damping factors;

c. in implementing a band-pass filter:

$$\alpha_1 \omega_0 = \frac{R_4 R_8}{R_6 R_9 R_1 C_1}, \text{ and}$$

$$\alpha_2 \omega_0 = \frac{R_4 R_7}{R_5 R_9 R_1 C_1}; \text{ and,}$$

d. in which the values of resistors $R_7$ and $R_8$ are equal.

* * * * *